United States Patent [19]

Derouiche

[11] Patent Number: 5,754,408
[45] Date of Patent: *May 19, 1998

[54] STACKABLE DOUBLE-DENSITY INTEGRATED CIRCUIT ASSEMBLIES

[75] Inventor: Nour Eddine Derouiche, Raleigh, N.C.

[73] Assignee: Mitsubishi Semiconductor America, Inc., Durham, N.C.

[*] Notice: The term of this patent shall not extend beyond the expiration date of Pat. No. 5,623,395.

[21] Appl. No.: 565,612

[22] Filed: Nov. 29, 1995

[51] Int. Cl.⁶ .............................. H01R 9/09; H01L 23/02
[52] U.S. Cl. .................. 361/773; 257/686; 257/777; 257/797; 361/735; 361/772; 361/783; 361/820; 439/69
[58] Field of Search .................. 174/52.4; 257/685, 257/686, 690, 692, 696, 723, 724, 730, 777, 797; 264/272.15; 361/760, 772, 773, 777, 783, 807, 820, 735, 744; 403/361; 437/205, 207, 208, 209, 217, 214, 220, 219, 224, 915; 439/68, 69, 83; 438/611, 111, 112, 123

[56] References Cited

U.S. PATENT DOCUMENTS

| | | |
|---|---|---|
| 3,671,812 | 6/1972 | Peluso et al. |
| 4,696,525 | 9/1987 | Coller et al. |
| 5,130,894 | 7/1992 | Miller. |
| 5,138,438 | 8/1992 | Masayuki et al. |
| 5,239,447 | 8/1993 | Cotues et al. |
| 5,279,029 | 1/1994 | Burns. |
| 5,287,000 | 2/1994 | Takahashi et al. |
| 5,311,401 | 5/1994 | Gates, Jr. et al. |
| 5,343,075 | 8/1994 | Nishino. |
| 5,616,962 | 4/1997 | Ishikawa et al. ............... 257/777 |
| 5,623,395 | 4/1997 | Derouiche ........................ 361/735 |

FOREIGN PATENT DOCUMENTS

| | | | |
|---|---|---|---|
| 55-61044 | 5/1980 | Japan | ............... 257/777 |
| 60-263448 | 12/1985 | Japan | ............... 257/696 |
| 3-32050 | 12/1991 | Japan | ............... 257/685 |
| 4-51590 | 2/1992 | Japan | ............... 361/820 |

OTHER PUBLICATIONS

IBM Technical Disclosure Bulletin "Stackable Plastic Semiconductor Chip Carrier" by Robock vol. 27 No. 4B pp. 2389 and 2390, Sep. 1984.

*Primary Examiner*—Donald Sparks
*Attorney, Agent, or Firm*—Lowe, Price, LeBlanc & Becker

[57] ABSTRACT

Integrated circuit (IC) packages having leads projecting in the vertical direction are provided with male and female locking elements of snap fasteners that allow a pair of IC packages to be stacked into a module so as to align the leads of one package with the leads of another package. The leads of the packages are soldered to a PCB that carries the external conductors to be connected with the inner circuits of the packages. The male locking element on one of the IC packages is tightly engaged with the female locking element on another IC package to prevent the soldered leads of one package from touching the leads of another package. Multiple modules are positioned on the PCB to double the packaging density of the PCB.

17 Claims, 9 Drawing Sheets

Fig. 1
(BACKGROUND)

Fig. 3
(BACKGROUND)

Fig. 2
(BACKGROUND)

Fig. 4

(BACKGROUND)

Fig. 5A
(BACKGROUND)

7 mils
9 mils
26 mils minimum
30 mils maximum
Motorola

Fig. 5B
(BACKGROUND)

7.4 mils
8.6 mils
16 mils minimum
50 mils maximum
Signetics

Fig. 5C
(BACKGROUND)

7 mils
10 mils
20 mils minimum
50 mils maximum
National

Fig. 6
(BACKGROUND)

STACKABLE DOUBLE-DENSITY INTEGRATED CIRCUIT ASSEMBLIES

TECHNICAL FIELD

The present invention relates generally to integrated circuit packaging, and more particularly, to integrated circuit (IC) packages arranged in a stack to produce a double-density IC assembly.

BACKGROUND ART

In an electronic system, components must be mounted on some interconnection network for communication to other parts of the system. The components of various types and configurations can be attached to a printed circuit board (PCB) to make the board a functional electronic device. To reduce costs of the assembly, semiautomatic or automatic insertion of components into PCBs are employed. However, multi-leaded components, e.g. integrated circuits, present problems for semiautomatic or automatic assembly because of lack of uniformity of body size and shape, difficulty of maintaining desired lead conditions, and feed problems at the input to insertion mechanisms. Successful mechanized assembly for integrated circuits is being achieved by using relatively standard integrated circuit (IC) packages.

Suitable packages for an integrated circuit must satisfy a series of requirements. They must be strong enough mechanically to withstand the stresses occurring during use and provide easily established and reliable electrical connection from the circuit inside to the external environment.

Figure 1:
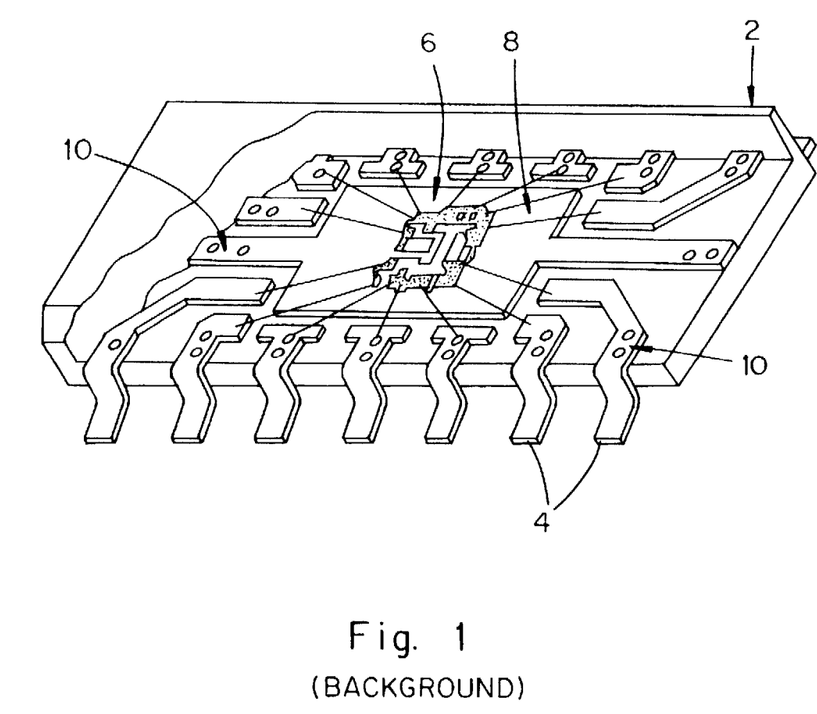
FIG. 1 shows the internal construction of a conventional SOIC package.

Leaded integrated circuit packages can be formed in various configurations. For example, the Small Outline Integrated Circuit (SOIC) package illustrated in FIG. 1 includes an epoxy body 2 having two rows of leads 4 projecting from opposite edges of the body 2. An IC die 6 enclosed within the body is coupled to the leads 4 via gold bonding wire 8. The leads are preferably perforated between the lead bonding pads and just inside the body edge. Perforations 10 provide mechanical strength to aid in the adhesion of the epoxy to the leads. The SOIC packages have leads of gull-wing configuration. As shown in FIG. 1, each lead extending outwardly from the package sidewalls is bent outwardly to form a foot parallel to the top and bottom surfaces of the package, and parallel to the printed circuit board (PCB) to which it is mounted.

Figures 2, 3:
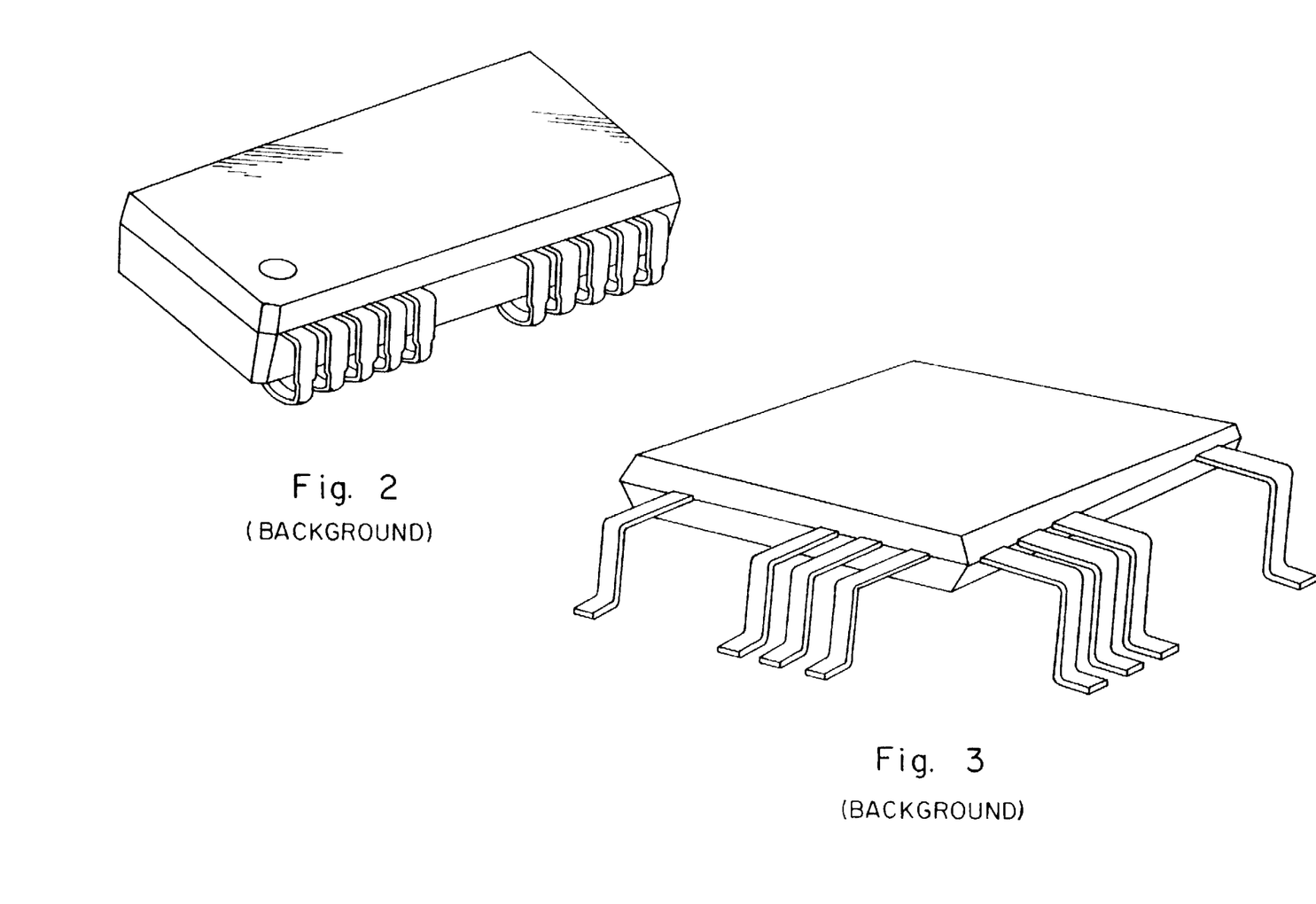
FIG. 2 illustrates a conventional SOJ package.
FIG. 3 shows an example of a conventional QFP package.

Another common configuration for IC packages is the Small Outline J-leaded (SOJ) package illustrated in FIG. 2. The SOJ package has two rows of leads extending outwardly from the opposite sidewalls and bent in the shape of a "J" under the package body.

Figure 4:
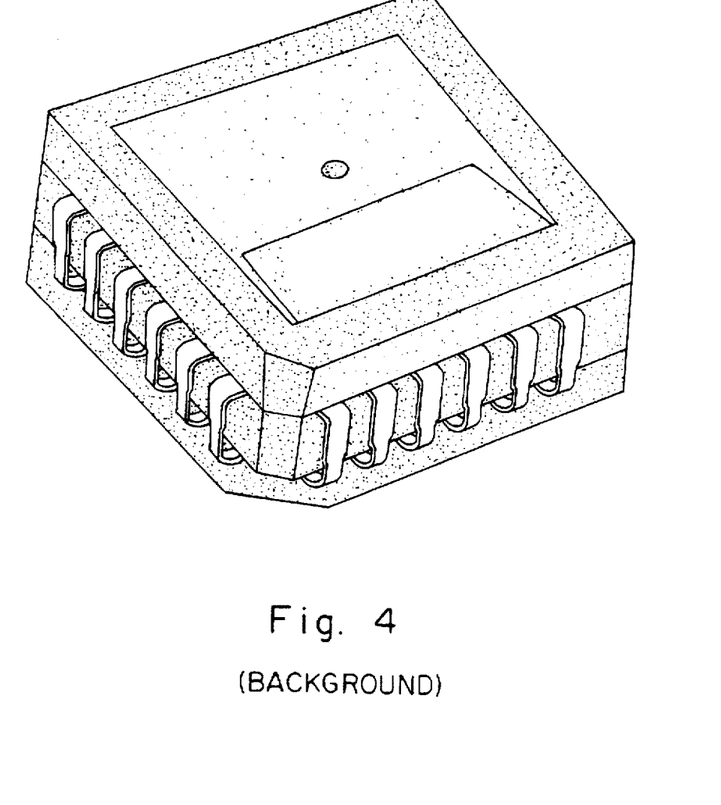
FIG. 4 illustrates a conventional PLCC package.

Square or quad IC packages have a body of a square shape with leads extending from all four sides of the body. FIG. 3 illustrates the Quad Flat Pack (QFP) package having leads of gull-wing configuration, and FIG. 4 shows the Plastic Leaded Chip Carrier (PLCC) with J leads on all four sides of the package.

Figure 5A:
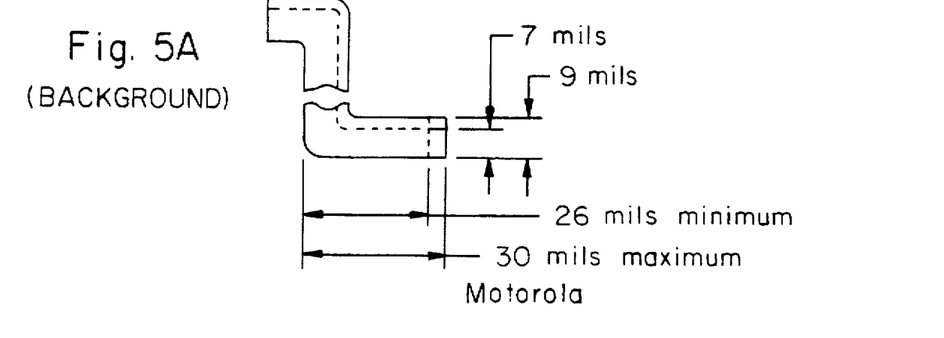
FIGS. 5A–5C show variations of lead profiles for SOICs of different manufacturers.
Figure 5B:
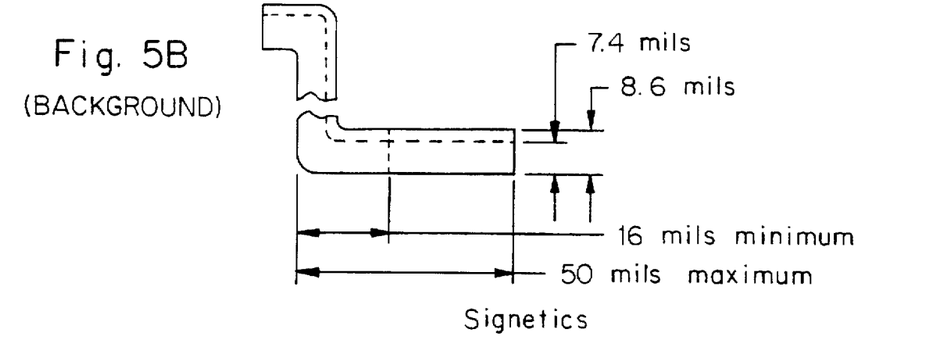
Figure 5C:
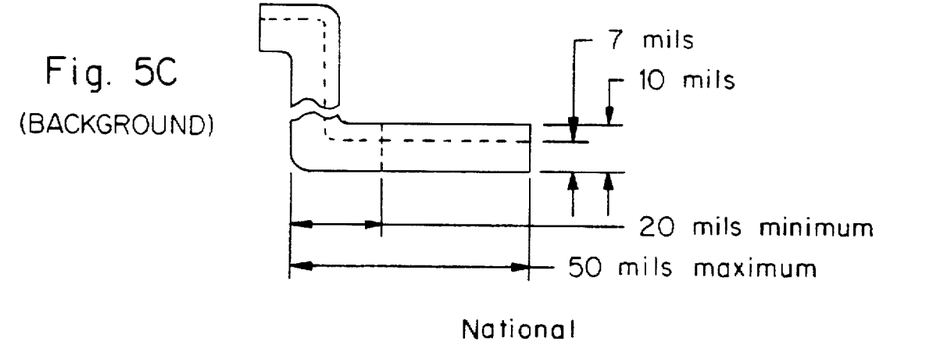

Component manufacturers offer wide tolerances of lead profiles for IC packages. For example, as shown in FIG. 5A, Motorola provides foot lengths from 26 mils to 30 mils for the same part number of SOIC packages. Signetics offers SOIC foot lengths from 16 mils to 50 mils for the same part number (FIG. 5B), and National provides SOIC foot lengths from 20 mils to 50 mils for the same part number (FIG. 5C). Also, as shown in FIGS. 5A–5C, various lead widths are available for the same part number.

Figure 6:
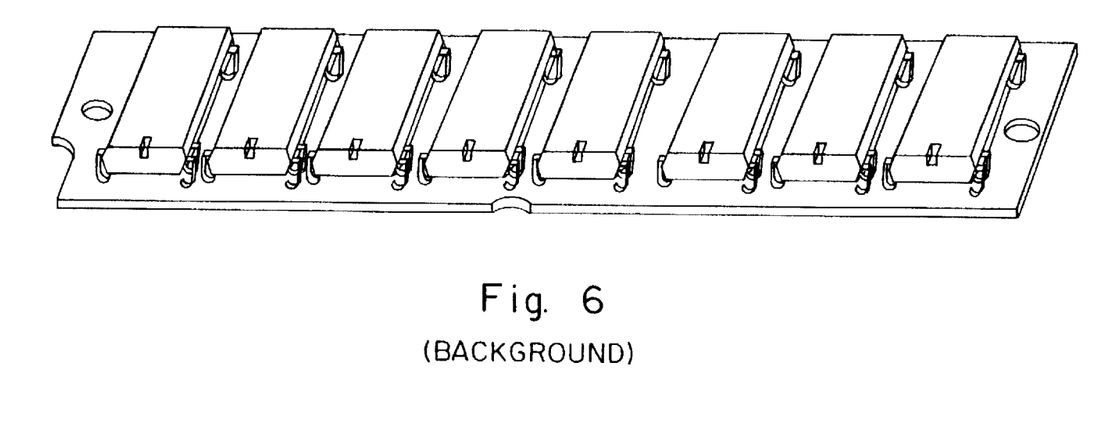
FIG. 6 shows an example of a conventional PCB carrier.

To provide an IC package assembly, for example, a memory module of very high capacity, a group of IC packages are usually assembled on a PCB carrier connected with a system PCB or a mother board that carries the circuits to be connected with the inner circuits of the IC packages. As illustrated in FIG. 6, such a PCB carrier may have multiple packages mounted on a printed board and interconnected with each other by printed conductors on the printed board.

Due to space limitations in some portable applications, for example, in laptop computers, an area occupied by a PCB carrier on a mother board for the same memory capacity should be minimized. To obtain higher packaging density, two IC packages may be combined in a stack, wherein one package is arranged on top of another. However, in portable systems, the packages in the stack may be moved with respect to each other. As a result, corresponding leads of the packages may touch each other, and cause a short-circuit.

To fix IC packages with respect to each other, a package stack may be inserted into a casing attached to a PCB. An example of such a casing having metallic lamination layers can be found in U.S. Pat. No. 5,279,029. Alternatively, a socket for receiving a package stack may be provided on a PCB, for example, see U.S. Pat. No. 4,696,525.

However, the prior art devices for stacking IC packages occupy substantial areas on a PCB and, therefore, reduce packaging density. Also, they include complicated mechanical arrangements that increase the manufacturing cost of a PCB.

Accordingly, it would be desirable to fix IC packages arranged in a stack to each other without reducing PCB packaging density.

Also, it would be desirable to provide a reliable high-density IC package assembly that is low in cost and easily implemented.

DISCLOSURE OF THE INVENTION

Accordingly, one advantage of the present invention is in providing a high-density IC package assembly wherein packages arranged in stacks are fixed to each other without reducing the packaging density of the assembly.

Another advantage of the present invention is in providing a high-density IC package assembly that is low in cost and easily implemented.

The above and other advantages of the invention are achieved, at least in part, by providing an electronic package assembly comprising a plurality of IC packages having top and bottom surfaces and leads projecting in a direction perpendicular to the top and bottom surfaces. The packages are combined in at least one stack including one of the IC packages having its bottom surface arranged on the top surface of another package. At least one pair of male and female locking elements are fixed on adjacent top and bottom surfaces of the IC packages arranged in the stack for attaching the IC packages to each other so as to prevent the leads of one of the IC packages from touching the leads of another IC package.

In accordance with one aspect of the invention, the male and female locking elements attach the IC packages to each other so as to establish an air gap between the IC packages to allow forced cooling to be provided.

In accordance with another aspect of the invention, a pair of the male locking elements and a pair of the female locking elements are provided at each of the adjacent top and bottom surfaces for rigidly orienting the IC packages with respect to each other.

Preferably, the male and female locking elements are made of elastic material, to provide tight engagement with each other.

In accordance with a further aspect of the invention, the leads of all of the IC packages are directly soldered to a surface of a printed-circuit board having a row of contact lands designated for each of the IC packages. These rows may be displaced with respect to each other in a longitudinal direction.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of electronic packaging, the best mode for practicing the invention is based in part on the realization of a structure composed of IC packages with gull-wing and J lead configurations. However, it is to be understood that the present invention is also applicable to assemblies that include electronic packages of any type.

Figure 7:
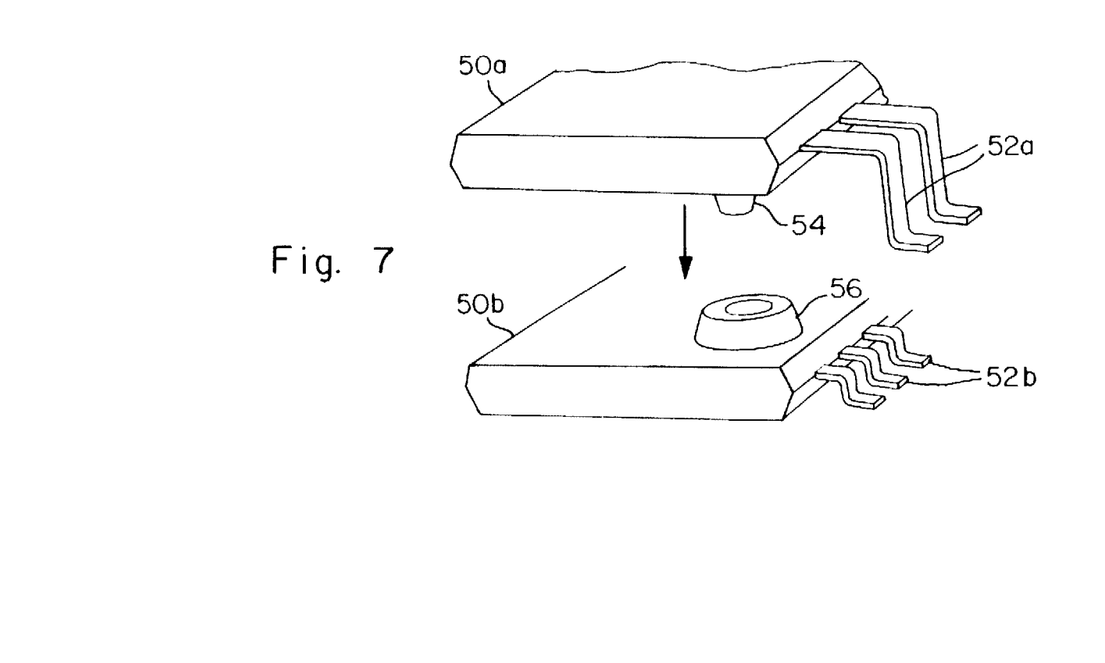
FIG. 7 shows a pair of gull-wing packages of the present invention.

Reference is now made to FIG. 7 of the drawings showing a pair of IC packages 50a and 50b having gull-wing leads 52a and 52b, respectively. Male locking element 54 is fixed on the bottom surface of the top package 50a, whereas female locking element 56 is fixed on the top surface of the bottom package 50b.

Figure 8:
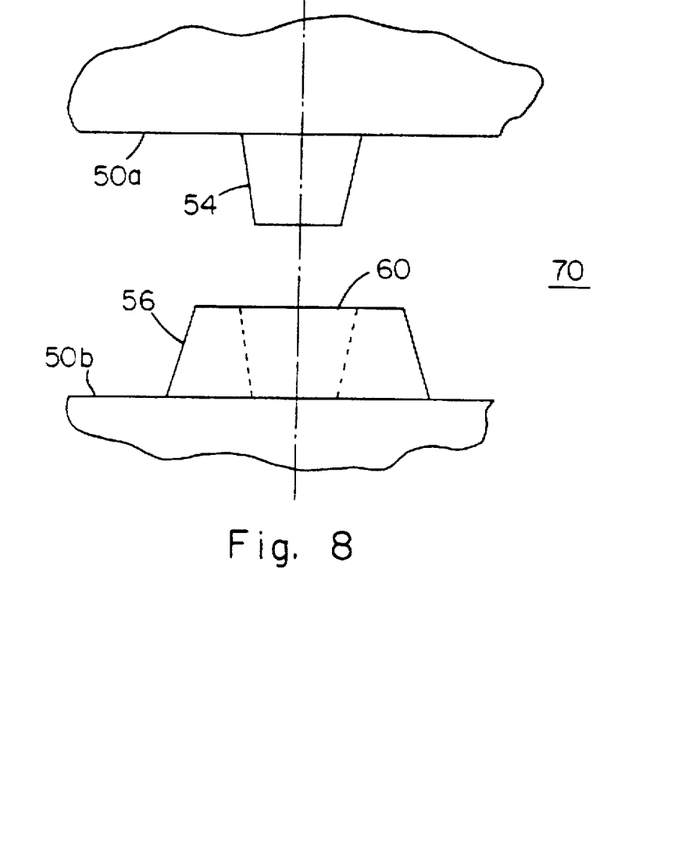
FIG. 8 illustrates interaction between male and female locking elements of a snap fastener

As shown in FIG. 8, the male locking element 54 on the top package 50a can be pressed manually or mechanically into an opening 60 of the female locking element 56 on the bottom package 50b to engage the packages 50a and 50b with each other. The locking elements 54 and 56 are made of elastic material, e.g. plastic, to provide tight engagement. Hence, each pair of the opposite locking elements on the packages 50a and 50b constitutes a snap fastener 70 for attaching the packages 50a and 50b to each other.

Figure 9:
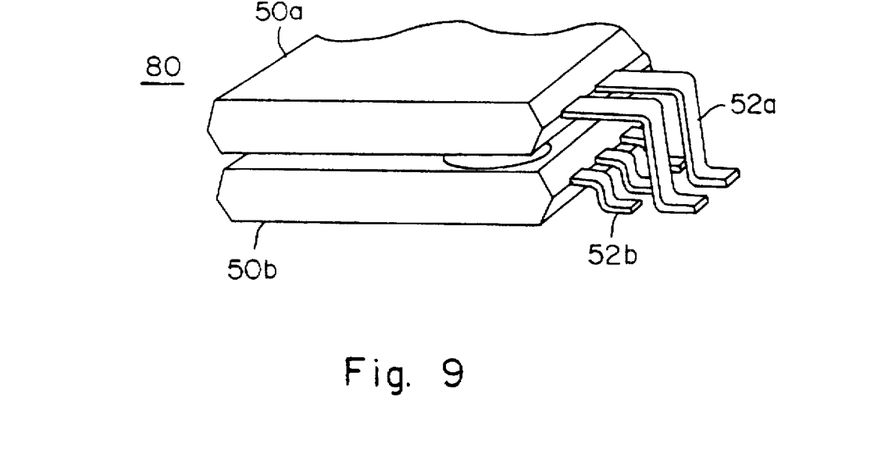
FIG. 9 shows a double-density module composed of the packages shown in FIG. 7.

FIG. 9 illustrates an IC package assembly 80 composed of the packages 50a and 50b arranged in a stack. As discussed above, the wide range of lead profiles is available for the same type of an IC package. Thus, the lead profiles of the packages 50a and 50b may be selected so as to avoid mechanical contacts between the corresponding leads 52a and 52b. An air gap is maintained between the packages 50a and 50b to allow forced air cooling to be provided. The packages are rigidly oriented by the male and female locking elements 54 and 56 so as to align the leads of one package with respect to the leads of another package during a placement procedure before soldering to a PCB. As a result, the soldered packages will not shift with respect to each other. Thus, the locking elements 54 and 56 prevent the leads of the top and bottom packages from touching each other to avoid a short-circuit.

Figures 10, 10A:
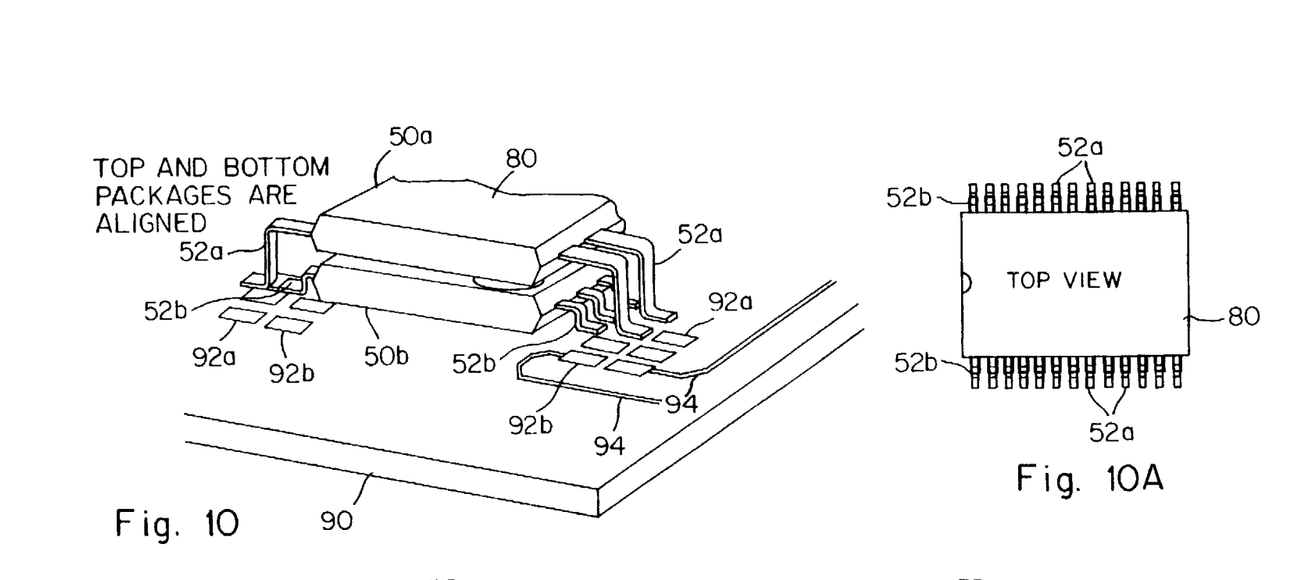
FIGS. 10 and 10A illustrate the double density module on a PCB with no displacement between contact lands.

As shown in FIG. 10, the leads 52a and 52b of the IC package assembly 80 may be soldered to a PCB 90 having two rows of contact lands 92a and 92b arranged along both edges of the assembly 80. Printed conductors 94 are provided to connect the contact lands 92a and 92b to other contact lands on the PCB 90. The feet of the leads 52a are soldered to the contact lands 92a, whereas the feet of the leads 52b are soldered to the contact lands 92b. As illustrated in FIG. 10A showing a top view of the assembly 80 in FIG. 10, corresponding lands 92a and 92b are aligned with each other so as to position the leads 52b under the leads 52a.

Figure 11:
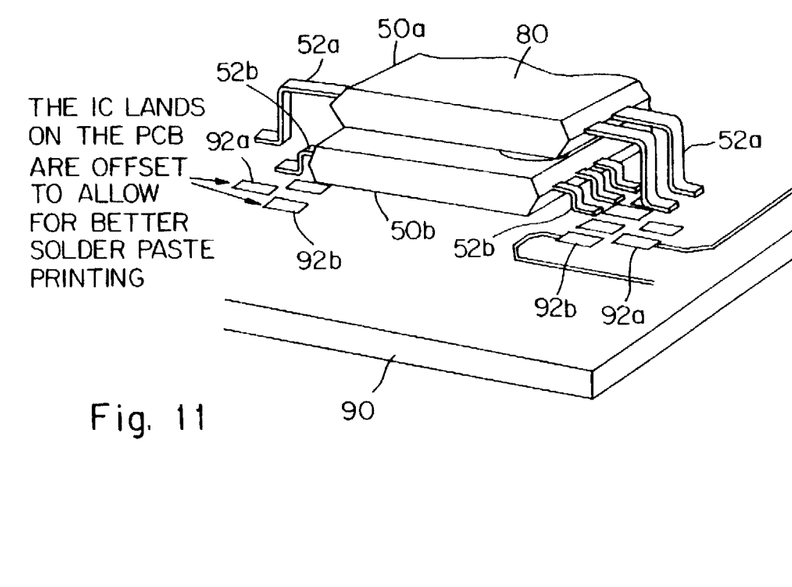
FIGS. 11 and 11A show the double density module on a PCB provided with contact lands displaced with respect to each other.
Figure 11A:
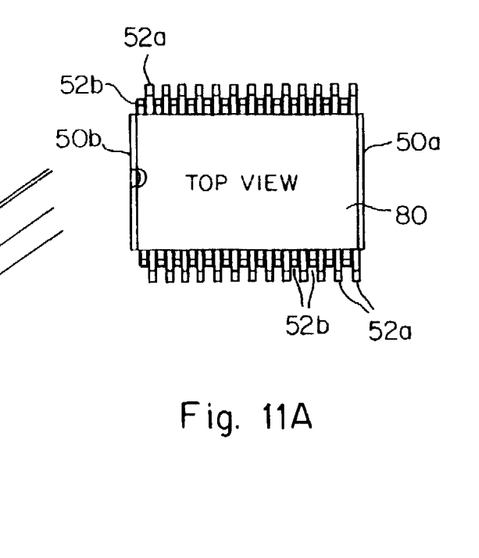

Alternatively, as shown in FIG. 11, the corresponding contact lands 92a and 92b may be displaced so as to align the lands 92a with a gap between the lands 92b. As illustrated in FIG. 11A showing a top view of the assembly 80 in FIG. 11, the packages 50a and 50b are displaced so that leads 52a are positioned above gaps between the leads 52b. The land displacement allows solder paste printing of the lands 92a and 92b to be facilitated.

Figures 12, 13:
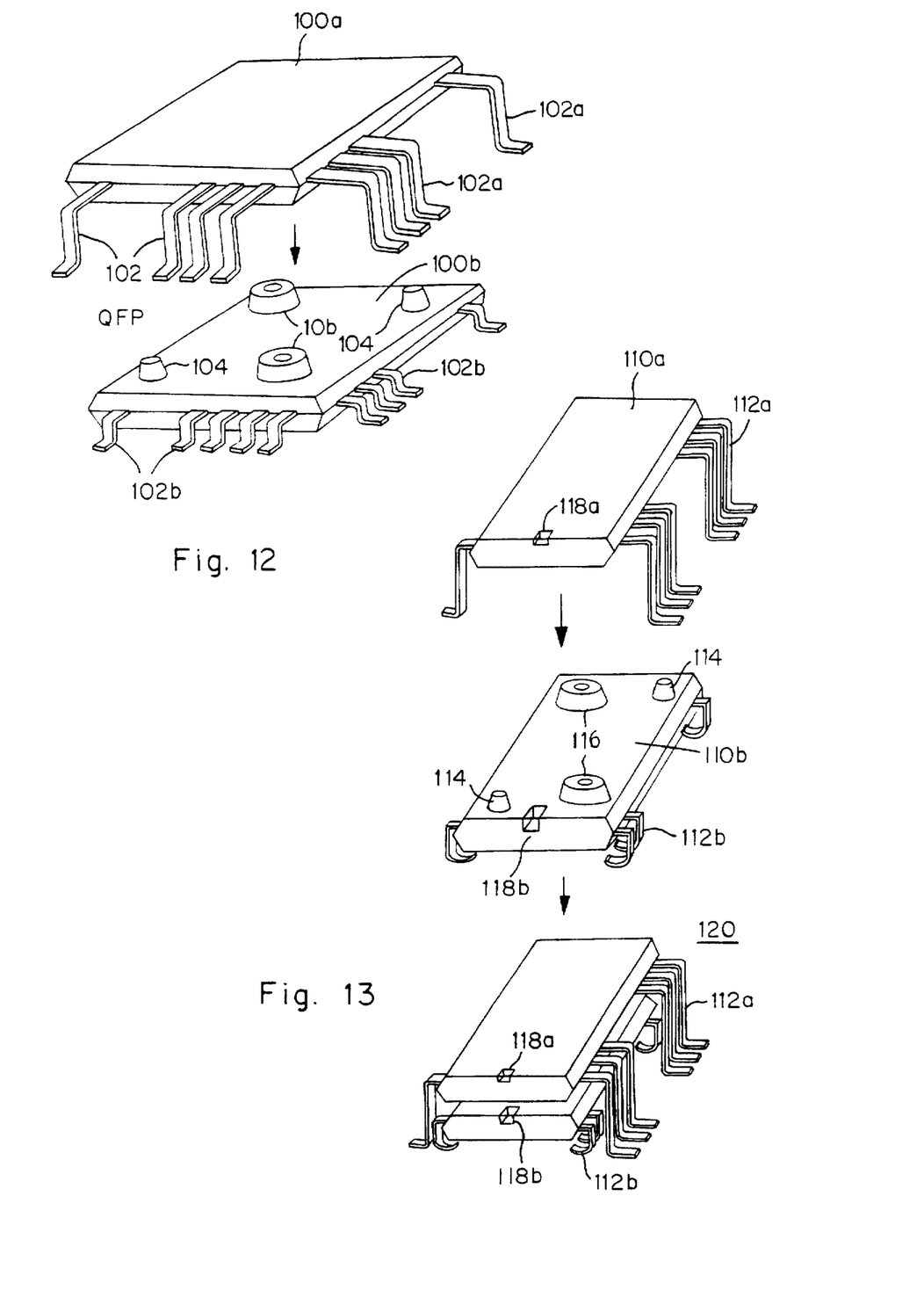
FIG. 12 shows QFP packages of the present invention.
FIG. 13 illustrates assembling a double-density module composed of gull-wing and J-leaded packages.

Reference is now made to FIG. 12 showing another embodiment of the present invention. QFP packages 100a and 100b having gull-wing leads 102a and 102b, respectively, that project from all four sides of the packages may be arranged in a stack using a pair of male locking elements 104 and a pair of female locking elements 106 on each of the packages. The top package 100a has the locking elements 104 and 106 arranged near the corners of its bottom surface, whereas the locking elements 104 and 106 of the bottom package 100b are provided near the corners of its top surface. The locking elements of the same type are arranged in the opposite corners of the packages. The male and female locking elements 104 and 106 rigidly orient the packages 100a and 100b during placement so as to align the leads 102 and 104 with respect to each other. The tight engagement of the corresponding locking elements on the packages 100a and 100b prevents the leads 102a and 102b from touching each other.

As shown in FIG. 13, the present invention allows IC packages having different lead configurations to be stacked. For example, a top package 100a has a gull-wing configuration of leads 112a, whereas a bottom package 100b has J leads 112b. Pairs of male and female locking elements 114 and 116 are provided near corners of the opposite surfaces of the packages 110a and 110b. The lead profiles of the packages may be selected during placement to avoid mechanical contacts between the leads 112a and 112b in a module 120 composed of the packages 110a and 110b. Alignment recesses 118a and 118b on the packages 110a and 110b allow the packages to be oriented during placement.

Figure 14:
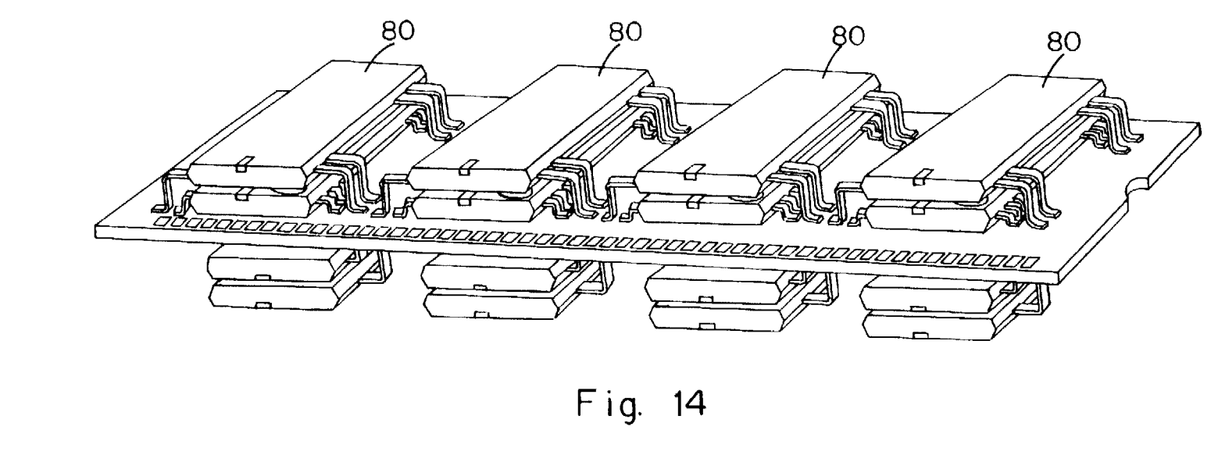
FIG. 14 shows a PCB having multiple modules composed of gull-wing packages.
Figure 15:
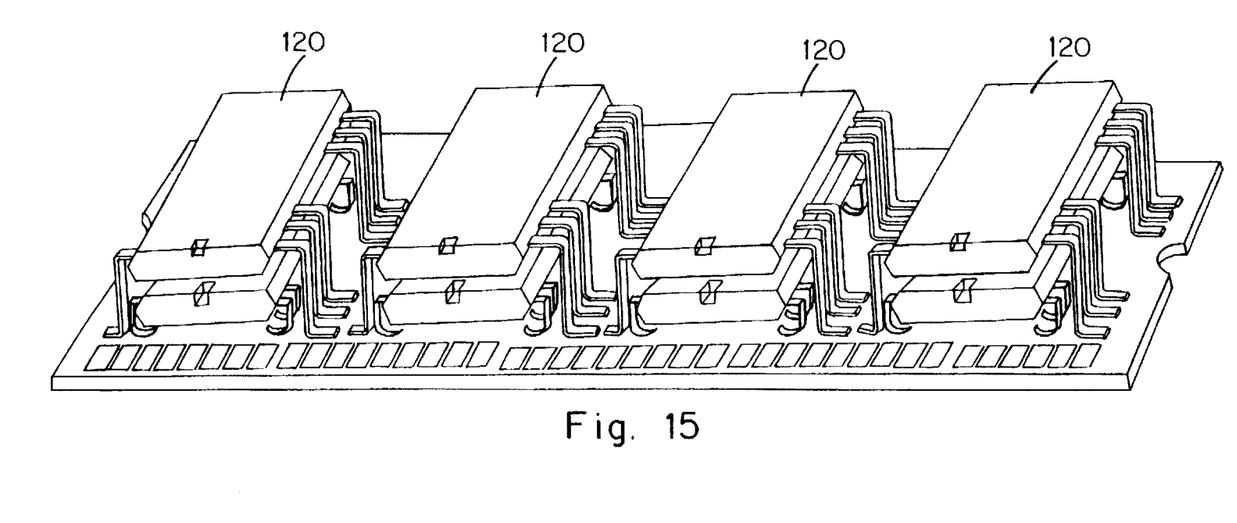
FIG. 15 illustrates a PCB having multiple modules composed of gull-wing and J-leaded packages.

As illustrated in FIGS. 14 and 15, multiple modules 80 and 120 shown in FIGS. 9 and 13, respectively, may be positioned on a PCB so as to double the packaging density of the PCB compared to a conventional PCB. Although the drawings show that each of the modules 80 and 120 is composed of two IC packages, it is to be understood that any number of the packages can be stacked.

In summary, the results and advantages of the DIP package assembly of the present invention can now be more fully appreciated. IC packages having leads projecting in the vertical direction are provided with locking elements of snap fasteners that allow a pair of IC packages to be stacked into a module so as to align the leads of one package with respect to the leads of another package. The leads of the packages are soldered to a PCB that carries the external conductors to be connected with the inner circuits of the packages. The tight package engagement provided by the locking elements prevents the soldered leads of one package from touching the leads of another package. Multiple modules are positioned on the PCB to double the packaging density of the PCB.

Accordingly, a high-density IC package assembly is provided wherein packages arranged in stacks are fixed to each other without reducing the packaging density of the assembly.

It will also be recognized that the high-density package assembly of the present invention is low in cost and easily implemented.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

I claim:

1. An electronic package assembly, comprising:
   a plurality of IC packages having top and bottom surfaces and leads projecting in a direction approximately perpendicular to the top and bottom surfaces, said packages being combined in at least one stack including one of the IC packages having the bottom surface arranged on the top surface of another of the IC packages, and
   male and female locking elements fixed on adjacent top and bottom surfaces of the IC packages in the stack and constituting snap fasteners for attaching said IC packages to each other, a pair of the male locking elements and a pair of the female locking elements being provided at said adjacent top and bottom surfaces for rigidly orienting the IC packages with respect to each other so as to prevent the leads of each of the IC packages from touching the leads of other IC packages.

2. The assembly of claim 1, wherein said male and female locking elements attach the IC packages to each other so as to establish an air gap between the IC packages to allow forced cooling to be provided.

3. The assembly of claim 1 wherein said male and female locking elements are made of elastic material, to provide tight engagement with each other.

4. The assembly of claim 1, wherein said male and female locking elements provide alignment between the leads arranged along two opposite edges of each of the IC packages.

5. The assembly of claim 1, wherein said male and female locking elements provide alignment between the leads arranged along all four sides of each of the IC packages.

6. The assembly of claim 1, wherein said male and female locking elements provide alignment between the leads having gull-wing configuration of one of the IC packages and the leads having gull-wing configuration of another of the IC packages.

7. The assembly of claim 1, wherein said male and female locking elements provide alignment between the leads having gull-wing configuration of one of the IC packages and the leads having J-configuration of another of the IC packages.

8. The assembly of claim 1, wherein the leads of all of the IC packages are directly soldered to a surface of a printed-circuit board.

9. The assembly of claim 8, wherein said printed circuit board has a row of contact lands designated for each of the IC packages.

10. The assembly of claim 9, wherein the row of the contact lands designated for the leads arranged along an edge of one of the IC packages is displaced in a direction parallel to the edge, with respect to the row of the contact lands designated for another of the IC packages.

11. An electronic package assembly, comprising:
    first and second electronic packages, each having a flat body with top and bottom surfaces containing electronic elements, and a plurality of leads projecting in a direction approximately perpendicular to the top and bottom surfaces from at least two opposite edges of said body for connecting said electronic elements to a set of external conductors,
    said first electronic package having its bottom surface arranged on the top surface of said second electronic package, and
    at least a pair of male and female locking elements of a snap fastener mounted on the bottom surface of the first electronic package and on the top surface of the second electronic package, the body of the first electronic package being rigidly oriented by said locking elements with respect to the body of the second electronic package so as to align the leads of the first electronic package with the leads of the second electronic package.

12. The assembly of claim 11, wherein said first and second electronic packages are respectively soldered to first and second contact lands formed on a printed circuit board.

13. The assembly of claim 12, wherein each of said first contact lands is aligned with a gap between said second contact lands.

14. The assembly of claim 12, wherein each of said first contact lands is aligned with each of said second contact lands.

15. The assembly of claim 11, wherein the body of the first electronic package is rigidly oriented by said locking elements with respect to the body of the second electronic package so as to prevent the leads of the first electronic package from touching the leads of the second electronic package.

16. An electronic module, comprising:

a printed circuit board, a plurality of integrated circuit stacks composed of top and bottom integrated circuit packages having leads soldered to the printed circuit board, and at least a pair of male and female locking elements of a snap fastener attached to adjacent surfaces of the top and bottom integrated circuit packages of each of the stacks for rigidly orienting the too integrated circuit packages with respect to the bottom integrated circuit packages so as to prevent the leads of the too integrated circuit packages from touching the leads of the bottom integrated circuit packages.

17. The electronic module of claim 16, wherein said integrated circuit stacks are arranged on both surfaces of the printed circuit board.

* * * * *